(12) United States Patent
Philipsson et al.

(10) Patent No.: US 12,041,429 B2
(45) Date of Patent: Jul. 16, 2024

(54) VOLUME DEPENDENT AUDIO COMPENSATION

(71) Applicant: Audiodo AB (publ), Malmö (SE)

(72) Inventors: John Philipsson, Södra Sandby (SE); Roger Martinson, Malmö (SE)

(73) Assignee: Audiodo AB (publ), Malmö (SE)

( * ) Notice: Subject to any disclaimer, the term of this patent is extended or adjusted under 35 U.S.C. 154(b) by 137 days.

(21) Appl. No.: 17/628,774

(22) PCT Filed: Nov. 12, 2020

(86) PCT No.: PCT/SE2020/051086
§ 371 (c)(1),
(2) Date: Jan. 20, 2022

(87) PCT Pub. No.: WO2021/096413
PCT Pub. Date: May 20, 2021

(65) Prior Publication Data
US 2022/0279273 A1    Sep. 1, 2022

(30) Foreign Application Priority Data
Nov. 15, 2019   (SE) ..................... 1951317-5

(51) Int. Cl.
*H04R 3/04*    (2006.01)
*H04R 5/04*    (2006.01)
*H04S 3/00*    (2006.01)

(52) U.S. Cl.
CPC .............. *H04R 3/04* (2013.01); *H04R 5/04* (2013.01); *H04S 3/002* (2013.01); *H04R 2420/07* (2013.01); *H04R 2430/01* (2013.01)

(58) Field of Classification Search
CPC ........ H04R 3/04; H04R 5/04; H04R 2420/07; H04R 2430/01; H04S 3/002
See application file for complete search history.

(56) References Cited

U.S. PATENT DOCUMENTS

| 7,072,477 B1 * | 7/2006 | Kincaid ................. G06Q 99/00 381/104 |
| 8,964,998 B1 | 2/2015 | McClain |

(Continued)

FOREIGN PATENT DOCUMENTS

| CN | 109040885 B | 8/2019 |
| EP | 2541970 B1 | 1/2014 |

(Continued)

OTHER PUBLICATIONS

International Search Report and Written Opinion for related International Application No. PCT/SE2020/051086 date mailed Feb. 5, 2021.

*Primary Examiner* — Daniel R Sellers
(74) *Attorney, Agent, or Firm* — Renner, Otto, Boisselle & Sklar, LLP

(57) ABSTRACT

Presented is a method (100) for real-time processing an audio stream in an audio speaker arrangement comprising at least one audio speaker. The method (100) comprises receiving (110) an audio-stream and a playback volume associated with the audio-stream and determining (120) a playback sound pressure level of the audio speaker based on the playback volume and pre-stored acoustic transfer data. The pre-stored acoustic transfer data is associating the playback volume with the playback sound pressure level of the audio speaker. The method further comprises generating (130) a compensation filter based on amplitude compensation data associated with the determined playback sound pressure level and filtering (140) the audio-stream using the compensation filter and applying a gain factor to the audio stream generating a compensated audio-stream. The gain factor is configured such that a total audio power of the audio stream is preserved regardless of the compensation filter. The compensated audio stream is provided (150) to the audio (Continued)

speaker (21). Additionally, an audio speaker arrangement and a computer program product are presented.

15 Claims, 9 Drawing Sheets

(56) References Cited

U.S. PATENT DOCUMENTS

| | | | |
|---|---|---|---|
| 2006/0215844 A1 | 9/2006 | Voss | |
| 2010/0241256 A1 | 9/2010 | Goldstein et al. | |
| 2012/0063616 A1 | 3/2012 | Walsh et al. | |
| 2013/0148822 A1* | 6/2013 | Bithell | H04R 3/04 |
| | | | 381/97 |
| 2017/0077887 A1* | 3/2017 | You | H04R 3/04 |
| 2017/0133992 A1 | 5/2017 | You | |
| 2018/0098165 A1* | 4/2018 | Grimanis | H04R 3/04 |
| 2020/0136580 A1* | 4/2020 | Renner | G06N 3/04 |

FOREIGN PATENT DOCUMENTS

| | | |
|---|---|---|
| KR | 1020130106395 A | 9/2013 |
| KR | 1020190008529 A | 1/2019 |
| WO | 2006047600 A1 | 5/2006 |
| WO | 2015051263 A1 | 4/2015 |

\* cited by examiner

VOLUME DEPENDENT AUDIO COMPENSATION

This application is a National Phase Application of International Application No. PCT/SE2020/051086 filed Nov. 12, 2020, which claims priority of Swedish Application No. 1951317-5, filed Nov. 15, 2019, the entire disclosures of which are hereby incorporated by reference.

TECHNICAL FIELD

The present invention relates to compensation of audio and more precisely to a method and a device for compensating an audio-stream in an audio speaker arrangement.

BACKGROUND

Since the introduction of portable electronic equipment such as the Walkman™ in the late 1970's, the availability and quality of portable audio has been ever increasing. With the smartphone, every user of such a device has access to an almost endless supply of music and other audio content. The audio content will typically be experienced through a pair of headphones or other portable speakers.

The audio content is intended to sound in a specific way, e.g. the author and the producer of the content have a certain idea of how the content should be perceived by a listener. The same can be said with regards to the speakers and the headphone. The designers of those products typically have a vision of how their product should alter the audio content in order to create e.g. a brand specific sound or feeling.

One solution to this problem is to personalize a listening experience by having a listener perform a hearing test and adjust the audio to compensate for the result of the hearing test. Implementations of this concept is presented in US2006215844 wherein an audio signal is filtered depending on a hearing profile of the listener.

The prior art is focused on the threshold for hearing, i.e. the lowest sound pressure audible to the listener. However, the audio played is rarely played at a volume that corresponds to the threshold for hearing.

In view of the above, it is evident that there is room for improvements.

SUMMARY

An object of the present invention is to provide a new type of audio compensation which is improved over prior art and which eliminates or at least mitigates the drawbacks discussed above. More specifically, an object of the invention is to provide an audio compensation that is determined without prior knowledge of the audio signal and is applicable to streamed audio. These objects are achieved by the technique set forth in the appended independent claims with preferred embodiments defined in the dependent claims related thereto.

According to a first aspect of the invention, a method for real-time processing of an audio-stream in an audio speaker arrangement is presented. The audio speaker arrangement comprises at least one audio speaker. The method comprises receiving an audio-stream and a playback volume associated with the audio-stream. From this, a playback sound pressure level of the audio speaker is determined based on the playback volume and pre-stored acoustic transfer data. The pre-stored acoustic transfer data is associating the playback volume with the playback sound pressure level of the audio speaker. The method further generates a compensation filter based on amplitude compensation data associated with the determined playback sound pressure level and filters the audio-stream using the compensation filter and applies a gain factor to the audio stream generating a compensated audio-stream. The gain factor is configured such that a total audio power of the audio stream is preserved regardless of the compensation filter. The compensated audio-stream is provided to the audio speaker.

In one embodiment of the method, the amplitude compensation data is based on equal loudness contours. By basing the amplitude compensation data on equal loudness, the audio-stream will be perceived in the same way regardless of playback sound pressure level.

In another embodiment, the amplitude compensation data comprises amplitude compensation values for a number of different frequencies and a number of playback volumes. By adding frequency dependencies, the audio-stream will be perceived in the same way regardless of playback sound pressure level.

In an additional embodiment, the method further comprises the steps of receiving an updated playback volume, that is different from the playback volume, and determining an updated playback sound pressure level of the audio speaker based on the updated playback volume and the pre-stored acoustic transfer data. An updated compensation filter is generated based on amplitude compensation data associated with the determined updated playback sound pressure level. The audio-stream is filtered to generate the compensated audio-stream using the updated compensation filter. The compensated audio-stream is provided synchronized with the updated playback volume to the audio speaker using the updated compensation filter. By enabling the audio-stream to be provided synchronized with the change in playback volume will allow for the volume compensated audio-stream to be delivered to a user without disruption when the playback volume is changed.

In one embodiment, the step of filtering further comprises applying a gain factor to the audio stream generating a compensated audio-stream. The gain factor is configured such that a total audio power of the audio-stream is preserved regardless of the updated compensation filter. This is useful since the application of the compensation filter may have a reducing or increasing effect on the audio-stream.

In yet another embodiment, the audio-stream is filtered in audio frames. Having the audio-stream in frames makes it possible to process, handle and transfer the audio-stream in chunks.

In a further embodiment, the steps of determining an updated playback sound pressure level and generating an updated compensation filter are executed during an intermediate time between the filtering of two consecutive audio frames. This makes the change in playback sound pressure level substantially instant without compromising the compensation of the audio-stream.

In one embodiment, the step of generating a compensation filter is additionally based on a hearing profile associated with a user of the audio speaker arrangement. Processing the audio-stream also based on the hearing profile will further increase the listening experience of the user.

In another embodiment, the audio-stream is formed in a channelized audio format. This is useful when audio-streams comprising more than one channel are enjoyed, e.g. stereo audio-streams or other multi-channel audio-streams.

In one embodiment, the channelized audio format comprises a left channel audio-stream and a right channel audio-stream. In this embodiment, the step(s) of generating the compensation filter further comprises generating a left compensation filter for the left channel audio-stream and a right compensation filter for the right channel audio-stream. This is beneficial when stereo audio-streams is enjoyed and/or when the hearing profile of the user is different on a left ear compared to a right ear.

In one embodiment, the compensation filter is a digital filter with linear phase response such as a FIR filter. FIR filters are beneficial since they can have an exactly linear phase, they are always stable, they are efficiently realized in hardware and the filter startup transients have finite duration.

In a second aspect of the invention, an audio speaker arrangement comprising at least one audio speaker, at least one memory, at least one external interface, and at least one controller operatively connected to said at least one audio speaker, said at least one memory and said at least one external interface is introduced. Said at least one controller is configured to in real-time receive, via the external interface, an audio-stream and a playback volume associated with the audio-stream, and to determine a playback sound pressure level of the audio speaker based on the playback volume and pre-stored acoustic transfer data. The pre-stored acoustic transfer data is associating the playback volume with the playback sound pressure level of the audio speaker. This is used to generate a compensation filter based on amplitude compensation data associated with the determined playback sound pressure level, and to filter the audio-stream using the compensation filter and applying a gain factor to the audio stream generating a compensated audio-stream. The gain factor is configured such that a total audio power of the audio-stream is preserved regardless of the compensation filter. The compensated audio-stream is provided to the audio speaker.

In one embodiment of the audio speaker arrangement, the external interface is wireless interface. Having a wireless external interface increases usability, comfort and flexibility of the audio speaker arrangement.

In on embodiment of the audio speaker arrangement, it is configured to perform the method for processing the audio-stream as disclosed above.

According to a third aspect, a computer program product is presented. The computer program product is configured to, when executed by a controller, cause the controller to, in real-time, receive an audio-stream and a playback volume associated with the audio-stream. The computer program product is also configured to determine a playback sound pressure level of an audio speaker based on the playback volume and pre-stored acoustic transfer data. The pre-stored acoustic transfer data is associating the playback volume with the playback sound pressure level of the audio speaker. From this, a compensation filter is generated based on amplitude compensation data associated with the determined playback sound pressure level, and the audio-stream is filtered using the compensation filter and applying a gain factor to the audio stream generating a compensated audio-stream. The gain factor is configured such that a total audio power of the audio-stream is preserved. The compensated audio-stream is provided to the audio speaker.

In one embodiment, the computer program product is further configured to cause the controller to perform the method for processing the audio-stream as disclosed above.

BRIEF DESCRIPTION OF THE DRAWINGS

Embodiments of the invention will be described in the following; references being made to the appended diagrammatical drawings which illustrate non-limiting examples of how the inventive concept can be reduced into practice.

DETAILED DESCRIPTION OF EMBODIMENTS

Hereinafter, certain embodiments will be described more fully with reference to the accompanying drawings. The invention may, however, be embodied in many different forms and should not be construed as limited to the embodiments set forth herein; rather, these embodiments are provided by way of example so that this disclosure will be thorough and complete, and will fully convey the scope of the invention, such as it is defined in the appended claims, to those skilled in the art.

Herein, the word playback system, playback device or playback volume is to mean playback in the sense of reproducing audio data received. The term is not to mean playback in the limiting form of playback of stored audio or media but it is to encompass all forms of media e.g. real time media, stored media, streamed medial, progressively downloaded media etc. In addition to this, the term compensation is to mean compensation in its broadest form and can, in this disclosure, be seen as synonymous to the term processing. This is applicable not only when describing actions but also when the term is used to describe an object, e.g. a compensation filter.

Figure 1A:
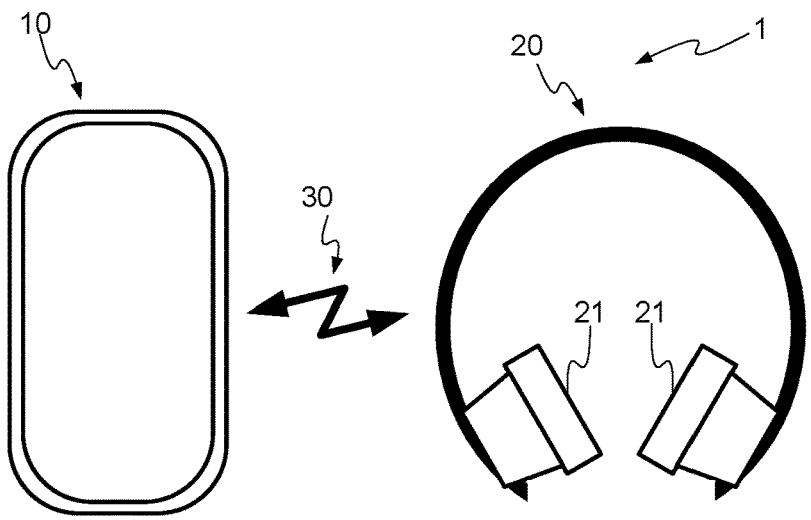
FIG. 1a is a view of an audio playback system according to embodiments of the invention.
Figure 7:
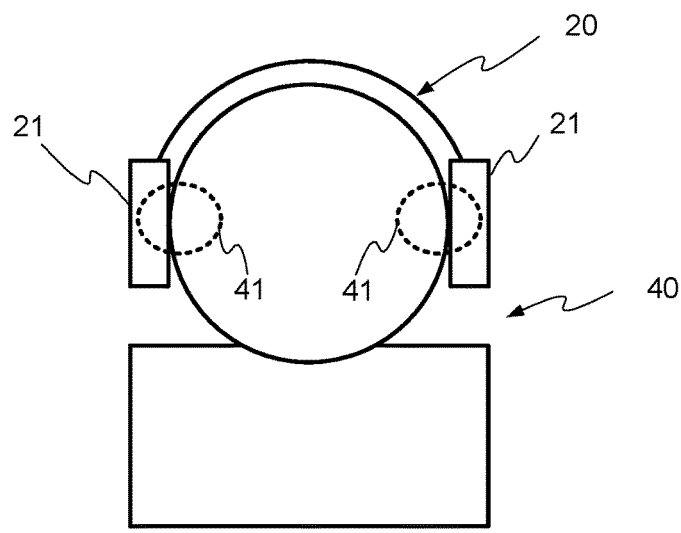
FIG. 7 is a view of an audio speaker arrangement in use according to embodiments of the invention.

In FIG. 1a, an audio playback system 1 is shown. The system 1 comprises an electronic device 10 configurable to transfer audio via an external interface 30 to an audio speaker arrangement 20. The audio speaker arrangement 20 comprises at least one audio speaker 21 arrangeable to provide an audio output to a user 40 (as shown in FIG. 7) of the audio playback system 1. Typically, the audio speaker arrangement 20 comprises two audio speakers 21 to enable stereo playback of the audio output.

The audio speaker arrangement 20 is, in one embodiment, a pair of headphones 20 and in a further embodiment, a pair of wireless headphones 20. The electronic device 10 may be a portable electronic device 10, e.g. a cellular phone, portable music player, tablet, laptop etc.

The electronic device 10 transfers audio to the speaker arrangement 20 in a form that is suitable for the external interface 30 and the audio speaker arrangement 20. The transfer may be either digital or analogue, which, in the concept of this disclosure, is to mean how the audio information is represented. The external interface 30 may be a wired or a wireless external 30 interface. If the external interface 30 is a wired interface, the transfer of audio from the electronic device 10 may be either in an analogue form or a digital form depending on the speaker arrangement 20. If the external interface 30 is a wireless interface, the transfer of audio from the electronic device 10 will typically be in digital form. The details of this disclosure are applicable regardless of the type of external interface 30 although most of the descriptions will be relating to an external interface 30 in the form of a wireless digital interface. The skilled person will, after reading this disclosure, understand how to alter the invention to also be successful with wired analogue or digital external interfaces 30.

Figure 1B:
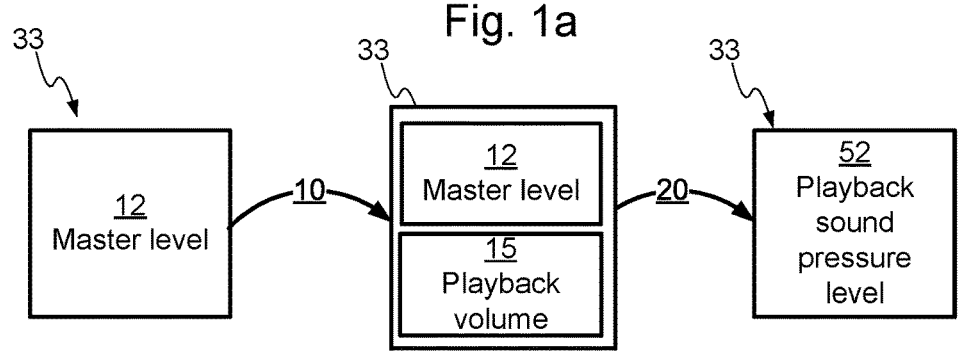
FIG. 1b is a block diagram of the signal flow of an audio playback system according to embodiments of the invention.

The audio playback system 1 introduced in FIG. 1a is used to provide an audio-stream 33 to the user 40 at a specific volume. With reference to FIG. 1b, the flow of the audio-stream 33 will be explained with some definitions. The audio-stream 33 is at some point recorded at a level that is called the master level 12. This master level 12 is basically the gain of the initial recording. The master level 12 is substantially the same between different recorded media, which makes it possible to listen to different media-streams without adjusting a playback volume 15.

The audio-stream 33, at its master level 12, is provided to the electronic device 10. The audio-stream 33 may be provided to the electronic device 10 e.g. as an audio component in streamed media from a streaming service, retrieved from a storage unit of the electronic device 10 etc. The user 40 of the electronic device 10 will, when listening to the audio-stream 33, set the playback volume 15 for the audio-stream 33. This setting of the playback volume 15 may be performed by adjusting the playback volume 15 by buttons or controls on the electronic device 10 or the audio speaker arrangement 20.

From the electronic device 10, the audio-stream 33 is provided, via the external interface 30, to the audio speaker arrangement 20. The audio-stream 33 is provided with the playback volume 15 as the audio-stream 33 is typically provided at the master level 12. It may be that the electronic device 10 changes to the master level 12 of the audio-stream 33 before providing it to the audio speaker arrangement 20. The audio speaker arrangement 20 receives the audio stream 33 and the playback volume 15 and uses the two to provide the audio-stream at a playback sound pressure level 52 to the user 40 of the audio speaker arrangement 20. The playback sound pressure level 52 is the sound pressure level at which the audio signal 33 is received by the user 40. The playback volume 15 will result in the playback sound pressure level 52 provided by the audio speaker 21. During playback of the audio-stream 33, the playback volume 15 may be changed a first factor, and this results in the playback sound pressure level 52 being changed a second factor. However, the playback sound pressure level 52 will depend on the type of audio speaker arrangement 20. The relation between the first factor and the second factor may be any kind of linear or non-linear relation. This relation is typically unknown to the electronic device 10 since one electronic device 10 may, in most cases, be used with many different audio speaker arrangements 20. The playback sound pressure level 52 is important when an audio signal should be perceived as intended when the audio signal was mastered.

The audio signal comprises a frequency spectrum, and this frequency spectrum of the audio signal will be perceived differently at different playback sound pressure levels 52. This can be seen when comparing equal loudness contours 300, see FIG. 2, at different sound pressure levels. One problem solved by the inventive concept of this disclosure is to enable the audio stream 33 to be perceived as intended, i.e. as it is perceived when mastered at the master level 12, regardless of the playback sound pressure level 52.

Figure 2:
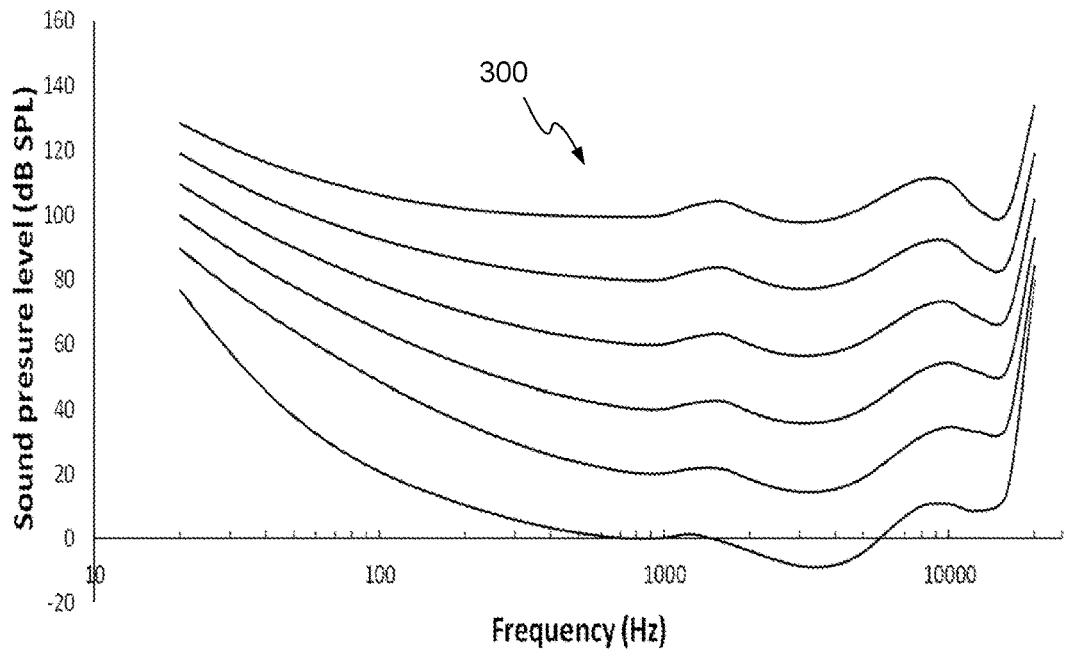
FIG. 2 is a graph of equal loudness contours according to embodiments of the invention.

A number of equal loudness contour 300 is shown in FIG. 2. An equal loudness contour 300 is a measure of sound pressure level, typically presented in decibel as dB Sound Pressure Level SPL. The sound pressure level is provided over a frequency spectrum, typically the audible spectrum for humans. Each point in the equal loudness contour 300 represents a sound pressure level for which a listener perceives a constant loudness when compared to a pure tone presented at 1 kHz with a certain phon. A phon is defined in in DIN 45631 and ISO 532, and will herein be defined to mean that a 1 kHz tone with a 50 dB SPL has a loudness of 50 phons and all other frequencies perceived with the same loudness as this signal also have a loudness of 50 phons.

In FIG. 2, the equal loudness 300 contours are plotted for different phons. In FIG. 2, equal loudness contours 300 are presented for 0, 20, 40, 60, 80 and 100 phons. The loudness contours 300 of FIG. 2 are loudness contours 300 according to ISO 226:213. These contours 300 are corrected compared to Fletcher-Munson curves provided by Harvey Fletcher and Wilden A. Munson in 1933. The Fletcher-Munson curves are commonly referred to as the first description of the concept of equal loudness. If the sound pressure level had no effect on how the frequency spectrum of an audio signal was perceived by a listener, the offset between the contours 300 in FIG. 2 would be the same across all frequencies.

Figure 3:
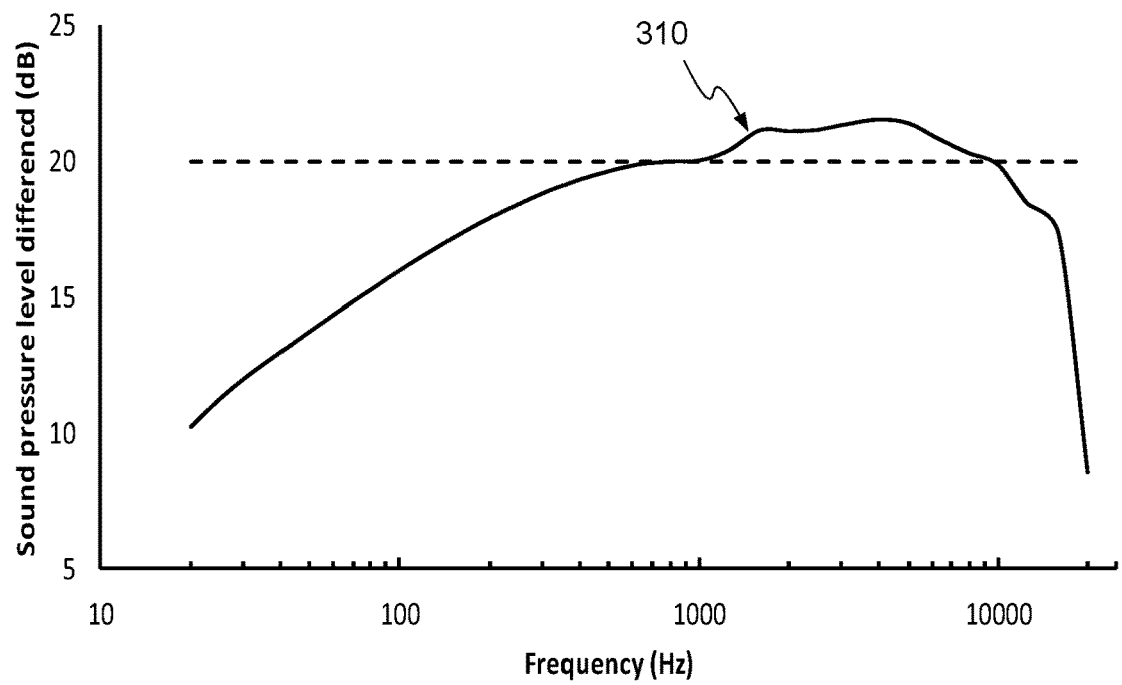
FIG. 3 is a graph of deltas between two equal loudness contours according to embodiments of the invention.

In FIG. 3, the delta 310 between the equal loudness contour 300 of 20 phons and 40 phons is illustrated. As seen, the difference 310 in sound pressure level is, as expected, 20 dB at 1 kHz, illustrated by the dashed line, but differs greatly from the expected 20 dB above and below 1 kHz. This effect results in that the audio playback is perceived to have different frequency spectrum depending on the sound pressure level of the playback.

The inventors of this disclosure have, after insightful reasoning and inventive thinking, realized that the effects described above can be compensated in the playback system 1 when an audio-stream 33 is being played from the electronic device 10. The solutions presented herein will compensate the audio-stream 33 based on the selected playback volume 15 and will change the compensation substantially instantaneously when the playback volume 15 is changed.

Figure 4:
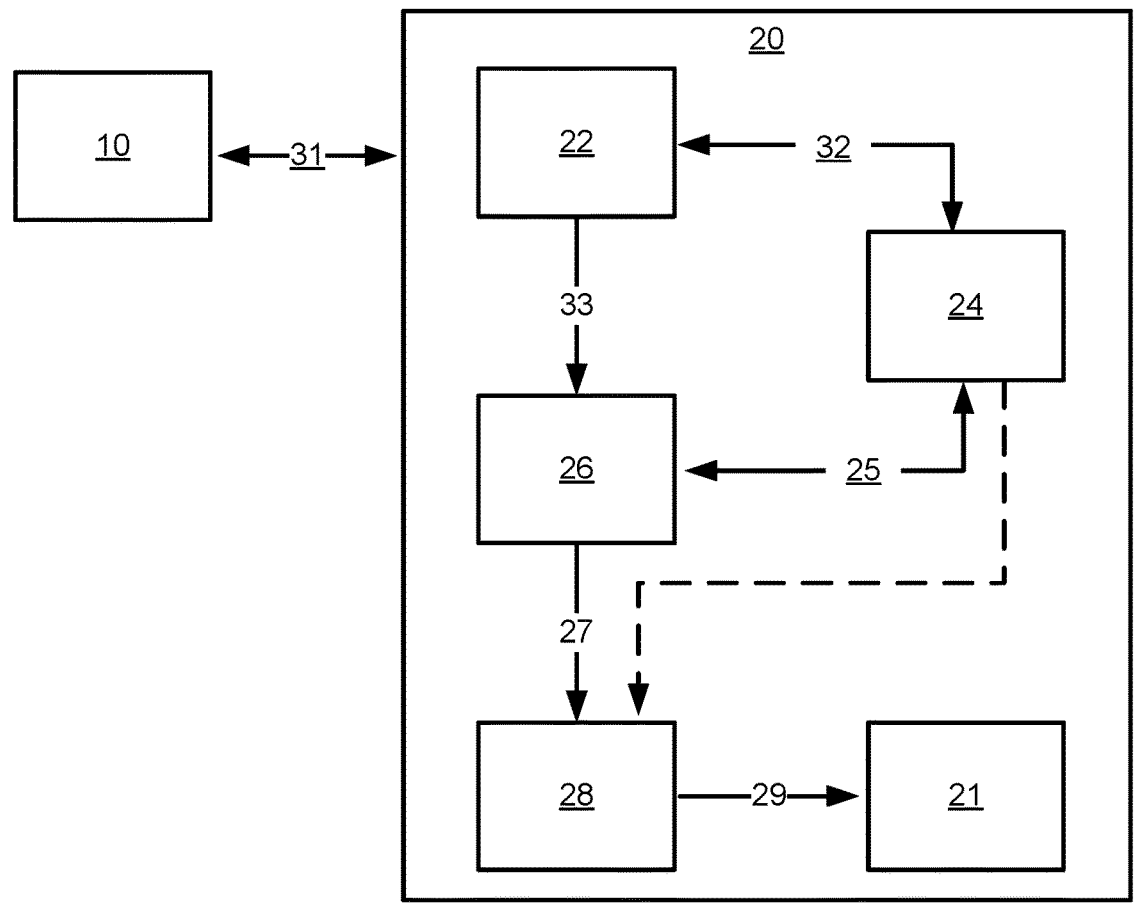
FIG. 4 is a block view showing the principals of compensating an audio-stream according to embodiments of the invention.

With reference to FIG. 4, the principals of compensating an audio-stream 33 according to the present invention will be illustrated. These principals will be explained with reference to the playback system 1 as introduced with FIG. 1a and many of the processing steps are performed in the device referenced as the audio speaker arrangement 20. However, it should be emphasized that the processing steps very well may be performed in the electronic device 10 or distributed between the electronic device 10 and the audio speaker arrangement 20.

In the schematic block diagram of FIG. 4, the electronic device 10 communicates a signal 31 via the external interface 30. The signal 31 comprises an audio-stream 33 and control data 32 associated with the audio-stream 33. The audio speaker arrangement 20 receives the signal 31 via the external interface 30 using a transceiver module 22 suitable for the external interface 30. For example, if in one embodiment the external interface is a Bluetooth low energy interface, the transceiver module 22 is a Bluetooth low energy transceiver module, and if in one embodiment the external interface is a wired serial interface, the transceiver module 22 is a wired serial transceiver module. The transceiver module 22 receives the signal 31, analyses the signal 31 and detects its components, e.g. the audio-stream 33 and its associated control data 32. Note that the detection and analysis may be performed by any suitable control circuitry and this functionality may be comprised in other modules of the audio speaker arrangement 20. The control data 32 is communicated to a control module 24 and the audio-stream 33 is communicated to a Digital Signal Processing, DSP, module 28.

Figure 9:
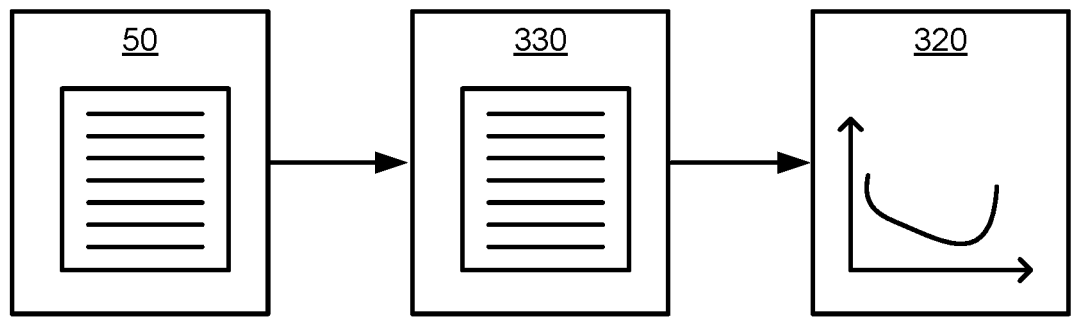
FIG. 9 is a schematic view of the generation of the compensation filter according to embodiments of the invention.

The control data 32 comprises a playback volume 15 associated with the audio-stream 33 and the control module 24 is provided with the control data 32 and a pre-stored acoustic transfer data 50 (shown in FIG. 6) describing how the playback volume 15 translates to a playback sound pressure level 52 of the audio speaker 21. The pre-stored acoustic transfer data 50 will be further explained in coming sections. The control module 24 generates a compensation filter 320 (as shown in FIG. 9) based on input parameters comprising the playback volume 15 and the pre-stored acoustic transfer data 50. The compensation filter 320 is in one embodiment represented as digital filter coefficients of a Finite Impulse Response, FIR, filter. The compensation filter 320 may be communicated as a DSP control signal 25 to the DSP module 28. The compensation filter 320 may be any kind of suitable filter or equalizing functionality such as an Infinite Impulse Response, IIR, filter.

The DSP module 28 comprises functionality to apply the digital filter coefficients supplied by the control module 24 when compensating the audio-stream 33 in order to provide a compensated audio-stream 27 to the audio speaker 21. The DSP module 26 may be configured to, in addition to applying the compensation filter 320 to the audio-stream 33, apply other processing functions relating to audio-streams e.g. noise cancellation, sound coloring, audio and musical effects, bass-boost, stereo widening, 3D-sound etc.

Before the compensated audio-stream 27 is fed to the audio speaker 21, it will typically be subjected to a digital to analogue, D/A, module 28 that converts the digital compensated audio-stream 27 into an analogue audio signal 29 that is provided to the audio speaker 21. The analogue audio signal 29 is a time variant audio signal having a voltage amplitude that relates to the playback volume 15. The voltage amplitude of the analogue audio signal 29 is what determines the playback sound pressure level 52 of the audio speaker 21.

As previously mentioned, there are different implementations possible to control the playback sound pressure level 52 of the audio speaker arrangement 20. Depending on how the playback sound pressure level 52 is controlled, handling of changes in playback volume 15 by a user 40 of the electronic device 10 may be handled differently.

In one embodiment, the playback sound pressure 52 level is controlled by applying a digital gain to the audio-stream 33 during the processing by the DSP module 26. A change in playback volume 15 will be executed by the DSP module 26 and application of an updated compensation filter 320 can be synchronized with application of the updated playback volume 15'. The synchronization can be controlled by the control module 24 or the DSP module 26.

In another embodiment, the playback sound pressure level is controlled by applying a digital gain and/or an analogue gain to the compensated audio-stream 28 during the processing by the A/D module 28. In such an embodiment, the updated gain is communicated to the A/D module 28 by the control module 24, illustrated by the dashed line in FIG. 4, and an updated compensation filter 320 is communicated to the DSP module 26. In this embodiment, the control module 24 is responsible for synchronizing the application of the updated compensation filter 320 with the updated playback volume 15'.

The embodiments regarding the updating of the playback volume 15 and the synchronization of an updated playback sound pressure level 52 with updated compensation filter 320 are to be considered as non-limiting examples. The embodiments can be combined where a volume change result in a change in digital gain of the DSP module 26 and a change in analogue gain of the A/D module 28. It is also possible that digital gain is controlled both by the DSP module 26 and the A/D module 28.

Figure 5A:
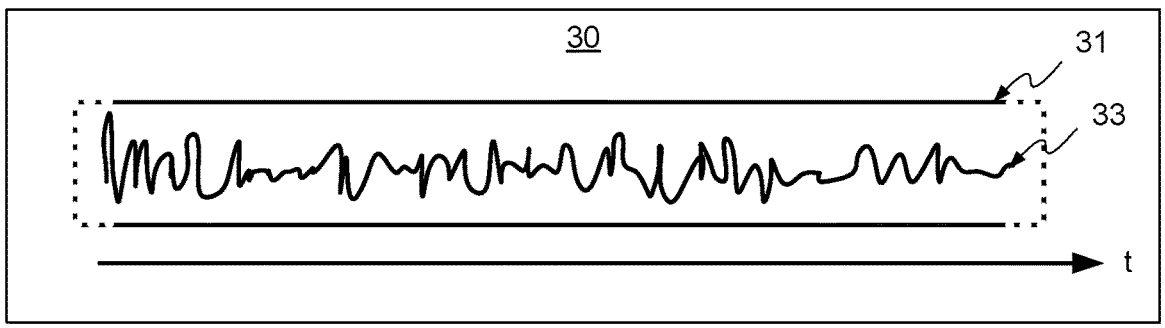
FIG. 5a-c are different views of an audio stream and its associated timing according to embodiments of the invention.
Figure 5B:
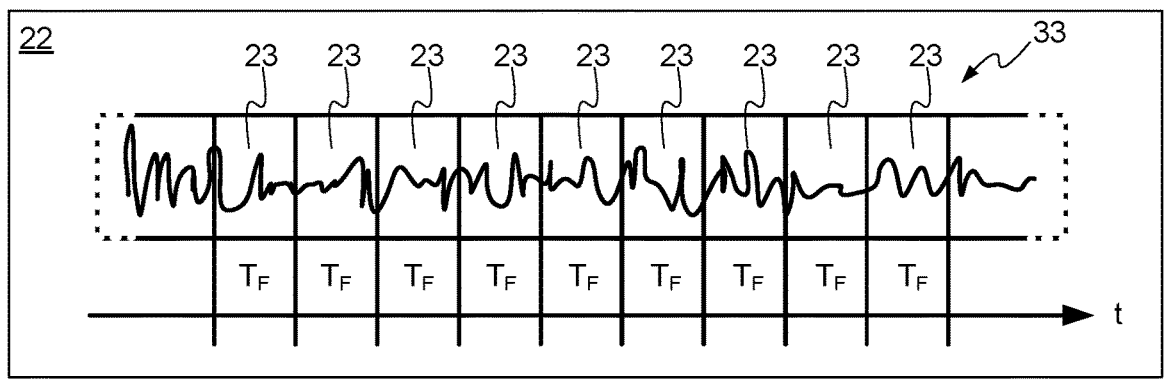
Figure 5C:
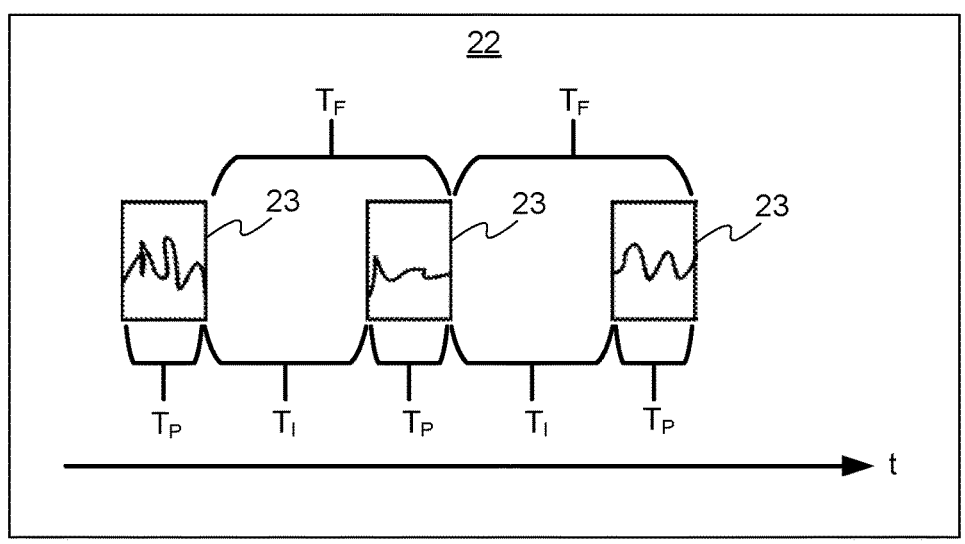

With reference to FIGS. 5*a-c*, the processing of the signal 31 will be described in further detail. In FIG. 5*a*, an exemplary audio-stream 33 is illustrated as comprised in the signal 31 communicated via the external interface 30. The audio-stream 33 is illustrated as a time variant signal for illustrative purposes only. The audio-stream 33 is typically formed as data packets and transmitted on e.g. a channel for audio-streaming in the external interface 30.

In FIG. 5*b*, the audio-stream 33 is received by the transceiver module 22 in audio frames 23. Each audio frame 23 holds data representing audio of a frame time $T_F$.

In one embodiment, each audio frame 23 holds 512 samples of audio data sampled at 44.1 kHz, this corresponds to a frame time $T_F$ of about 11.6 ms. It should be noted that the frame size may differ between systems. The audio frames 23 are typically received over the external interface 30 at a rate that is dependent on a transfer rate of the external interface 30. Problems related to the external interface 30 causing unwanted interruption of playback of the audio-stream 33, can be mitigated by the audio speaker arrangement 20 having a frame buffer. The frame buffer is configured to buffer frames 23 and reduce the risk of jitter in the playback. Assume that frames 23 are being received at a rate that is substantially equal to the frame time $T_F$, just one incorrectly received frame 23 may result in jitter in the playback of the audio-stream 33.

The audio frames 23 are provided to the DSP module 22 where they are processed by e.g. the compensation filter 320. The processing of each frame 23 by the DSP module 22 is referred to as the processing time $T_P$ and the processing time $T_P$ is shorter than the frame time $T_F$. The difference in time between the frame time $T_F$ and the processing time $T_P$ is an idle time $T_I$. During the idle time $T_I$, the DSP module will typically be in a sleep mode in order to conserve power and this time $T_I$ can be utilized to apply and/or generate and/or update the compensation filter 320. The generation of the compensation filter 320 is applicable in embodiments where e.g. the control module 24 and the DSP module 26 are the same module 24, 26 or the control module 24 instruct the DSP module 26 to generate the compensation filter 320 based on parameters from the control module 24. The filtered audio frames 23 are provided to the D/A module 28 as the compensated audio-stream 27. The compensated audio-stream 27 will typically be buffered in an output buffer in a manner similar to that of the previously disclosed frame buffer. The output buffer is typically clocked by a D/A clock and outputs are provided to the audio speaker 21. The D/A clock is typically associated with the sample rate of the audio data, 44.1 kHz in the embodiment above. The output buffer is a system design parameter and is in one embodiment configured to hold two audio frames 23.

By utilizing the idle time $T_I$ between two consecutive audio frames 23 to generate the compensation filter 320 it is possible to seamlessly and substantially instantly update the compensation filter 320 during playback of the audio-stream 33 synchronized with the change in playback sound pressure level 52 of the audio speaker 21. The teachings presented herein are such that the playback sound pressure level 52 audio-stream 33 is changed, from a perspective of the user 40, in real time. In other words, the time is takes from the reception of the updated playback volume 15 by the audio speaker to arrangement 20 to the change in playback sound pressure level 52 is extremely short, in the region of 10 ms.

Figure 6:
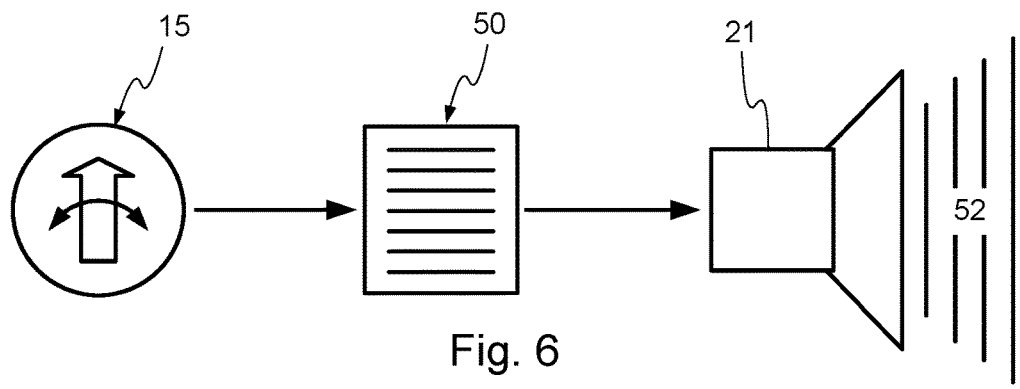
FIG. 6 is a schematic block diagram explaining pre-stored acoustic transfer data according to embodiments of the invention.

With reference to FIG. 6, the pre-stored acoustic transfer data 50 will be explained in further detail. The playback volume 15 is typically provided by the electronic device 10 and can be in many different forms. The playback volume 15 may be a percentage number where 100% is the highest playback volume possible or it may be discrete steps from e.g. 0 to 15 where 15 corresponds to the highest playback volume 15. The playback volume 15 is in either case configurable and it has to be related to the playback sound pressure level 52 of the audio speaker 21. The playback volume 15 is not necessarily directly related to a playback volume of the audio speaker arrangement 20. The audio speaker arrangement 20 may be configured with more or fewer steps of playback volumes than the electronic device 10. This is where the pre-stored acoustic transfer data 50 is used.

The pre-stored acoustic transfer data 50 provides means for relating the playback volume 15 of the electronic device 10 to the playback sound pressure level 52 of the audio speaker arrangement 20. As an example, if the audio speaker arrangement 20 is provided with functionality allowing 32 volume steps (0 to 31), each of these volume steps is related to a playback sound pressure level 52. If the electronic device 10 is provided with functionality allowing 16 volume steps (0 to 15), selection of the middle volume step, i.e. step 7, on the electronic device 10, will result in a selection of the middle volume step, i.e. step 15, in the audio speaker arrangement 20.

The pre-stored acoustic transfer data 50 may be formed in many different ways. It may be formed as a look-up table with absolute values of the playback sound pressure level 52 associated with the different volume steps of the audio speaker arrangement 20. Alternatively, one volume step of the audio speaker arrangement 20 may be selected as a baseline volume step associated with absolute values of the playback sound pressure level 52 and other volume steps of the audio speaker arrangement may be associated with playback sound pressure levels 52 being deltas to the absolute values of the baseline volume step.

In one embodiment, the pre-stored acoustic transfer data 50 comprises one or more playback volumes 15, each associated with a corresponding playback sound pressure level 52.

Optionally, the pre-stored acoustic transfer data 50 may for each playback volume 15, comprise more than one playback sound pressure level 52. The plurality of playback sound pressure levels 52 may be playback sound pressure levels of different playback frequencies. In one embodiment, one playback sound pressure level 52 is associated with each playback volume 15 of the audio speaker arrangement 20 and the playback sound pressure levels 52 are playback sound pressure levels 52 determined with a 1 kHz test tone. In another embodiment, one playback sound pressure level 52 is associated with each playback volume 15 of the audio speaker arrangement 20 and the playback sound pressure levels 52 are playback sound pressure levels 52 determined as the mean sound pressure when the audio speaker 21 is subjected to white noise.

In some of the embodiments, the pre-stored acoustic transfer data 50 is arranged in a table.

Not all possible playback volumes 15 needs to be listed in the pre-stored acoustic transfer data 50. If playback volumes 15 that are not listed in the pre-stored acoustic transfer data 50 are selected, an associated playback sound pressure level 52 may be calculated by interpolation of the playback volumes 15 closest below and above the un-listed playback volume 15 and their associated playback sound pressure levels 52. The pre-stored acoustic transfer data 50 may be stored such that playback volumes relating to equal loudness contours 300 of certain phons.

In some embodiments, the pre-stored acoustic transfer data 50 is represented as an equation describing the mathematical relation between the playback volume 15 and the playback sound pressure level 52. The pre-stored acoustic transfer data 50 is typically specific for one model of an audio speaker arrangement 20. The pre-stored acoustic transfer data 50 may be specific for a series of models of audio speaker arrangements 20. The pre-stored acoustic transfer data 50 may be specific for each unit of audio speaker arrangements 20. The pre-stored acoustic transfer data 50 may be stored in the audio speaker arrangement 20 at production of the audio speaker arrangement 20 or provided to the audio speaker arrangement at a later time through a firmware upgrade or e.g. when the user 40 of the audio speaker arrangement 20 decides to start using the volume dependent compensation of this disclosure.

The generation of the pre-stored acoustic transfer data 50 may be implemented by recording the playback sound pressure level 52 at certain playback volumes 15 available to the audio speaker arrangement 20.

With reference to FIG. 7, an embodiment wherein the audio speaker arrangement 20 is a pair of headphones 20 will be used for explaining the generation of the pre-stored acoustic transfer data 50. The headphones 20 are, during use by a user 40, worn such that audio form the headphones 20 is directed substantially directly towards ears of the user 40. The playback sound pressure level 52 that is to be used for compensating the audio-stream 33, is the sound pressure level 52 at the ears of the user 40. This means that the recording is preferably done at a region 41 in or around the ears of the user 40. One possibility is to use a phantom head in place of the user 40. Phantom heads comprising sound recording devices, e.g. microphones, are readily available on the market.

Figure 8A:
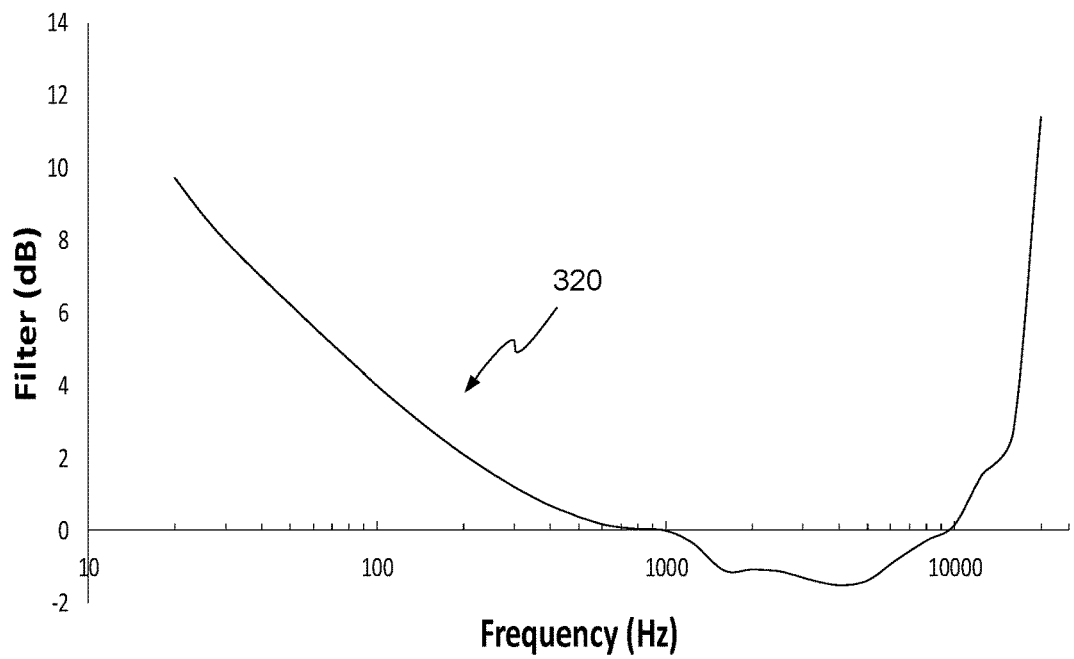
FIG. 8a-b is an exemplary graph of a compensation filer according to embodiments of the invention.

With the details of the previous sections, it is possible to compensate the audio-stream 33 based on the playback volume 15. As presented, sound, e.g. audio, is perceived differently depending on the playback sound pressure level 52 and different compensation filters 320 may be used for different playback sound pressure levels 52. The difference between the equal loudness contours 300 of 20 phons and 40 phons as presented in FIG. 3 can be compensated by the frequency response of the compensation filter 320 illustrated in FIG. 8a. Applying this compensation 320 when changing from a 1 kHz playback sound pressure level of 40 dB SPL to a 1 kHz playback sound pressure level of 20 dB SPL will compensate the difference in the perceived sound between the 40 phons equal loudness contour 300 and the 20 phons equal loudness contour 300. In this example, the compensation filter 320 is intended to be applied together with the 20 dB reduction of playback sound pressure level 52. This means, from data in FIG. 8a, that the sound pressure level 52 will be reduced 20 dB at 1 kHz but only around 10 dB at 20 Hz and even less at 20 kHz. By having the pre-stored acoustic transfer data 50, it is consequently possible to generate a compensation filter 320 depending on the playback volume 15 such that the perceived sound pressure level is substantially the same for all frequencies regardless of playback sound pressure level 52.

Figure 8B:
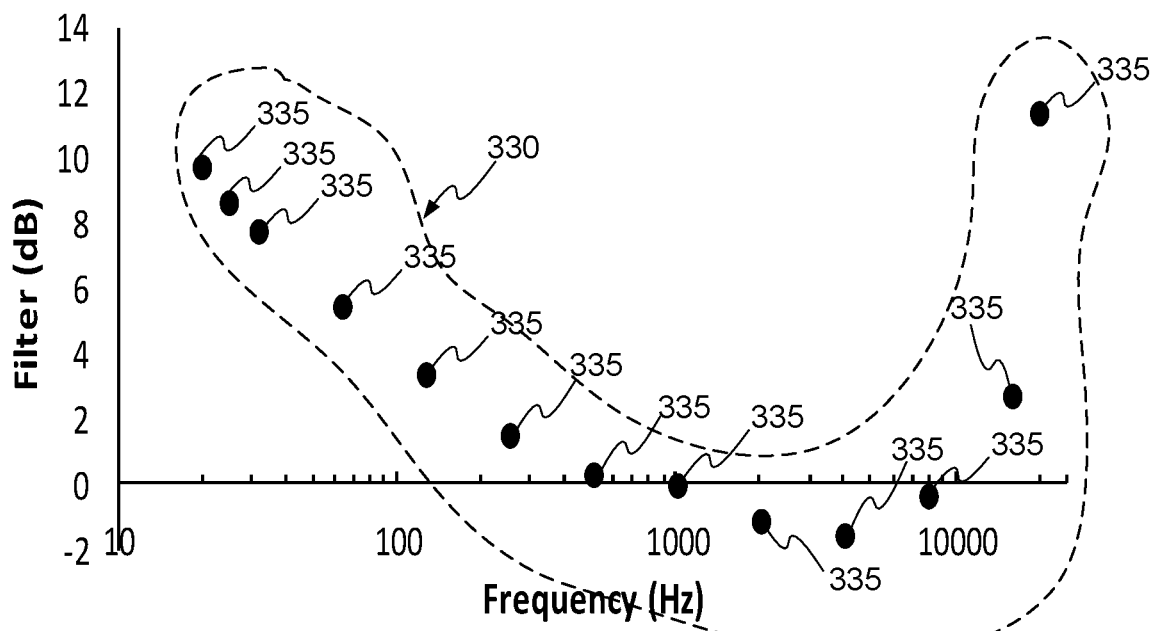

As illustrated in FIG. 8b, the compensation filter 320 may be represented as amplitude compensation data 330 comprising one or more amplitude compensation values 335. The amplitude compensation values 335 describe compensation per frequency. There can be any number of amplitude compensation values 335, each associated with a frequency or range of frequencies.

With reference to FIG. 9, the compensation filter 320 will be generated based on the playback sound pressure level 52 as determined from the pre-stored acoustic transfer data 50 and the playback volume 15. The compensation filter 320 may be generated by applying amplitude compensation data 330. The amplitude compensation data 330 may, as shown in FIG. 8b, comprise differences in amplitude filtering for a number of different frequencies and playback sound pressure levels 52. These differences may be represented by the amplitude compensation values 335. The amplitude compensation data 330 may comprise a reference level at a reference playback sound pressure level. At the reference level, the differences in amplitude filtering is zero and other playback sound pressure levels 52 in the amplitude compensation data 330 are described in relation to the reference level. If a match to a playback sound pressure level 52 is missing from the amplitude compensation data 330, interpolation between adjacent playback sound pressure levels 52 and their associated amplitude compensation data 330 is possible. The amplitude compensation data 330 may, as for the pre-stored acoustic transfer data 50, be mathematical functions translating a given playback sound pressure level 52 to a compensation filter 320.

In one embodiment, the amplitude compensation data 330 is based on equal loudness contours 300. In one embodiment, the amplitude compensation data 330 has a reference level corresponding to a playback sound pressure level 52 of 60 dB SPL. In one embodiment, the amplitude compensation data 330 has a reference level corresponding to the 60 phons equal loudness contour 300.

The compensated audio-stream 27 will have a different frequency content from the un-compensated audio-stream 33. It may be that high frequencies are amplified more than low frequencies or vice versa. It may be that, depending on the frequency content of the audio-stream 33, the playback sound pressure level 52 may be perceived as lower when the compensation filter 320 is applied. For instance, assume playback of an audio-stream 33 with the compensation filter 320 applied. If the playback volume 15 is increased and an updated compensation filter 320' is determined, the updated compensation filter may result in a substantially unchanged or even lower playback sound pressure level 52. Assume further that the playback volume 15 intended to give a 5 dB increase in playback sound pressure level 52. If an updated compensation filter providing 5 dB attenuation at low frequencies and 0 dB attenuation at high frequencies is applied, the playback sound pressure level will be increased by 5 dB at high frequencies and 0 dB at low frequencies. Now, if the audio stream 33 is having most of its audio power at low frequencies, i.e. very heavy in the bass, the accumulated audio power across all frequencies will be substantially lower with the updated compensation filter 320' applied.

In order to mitigate the abovementioned problem, the inventors have realized that it is possible to estimate a signal frequency content of an average audio-stream and estimate an average audio power of the average audio-stream at the master level 12. The frequency content of the average audio-stream is represented by a typical frequency distribution and this may be provided by analyzing a large amount of audio-streams in order to calculate the average audio stream and its associated typical frequency distribution. From this, a gain factor can be generated that ensures that the total audio power of the average audio-stream is substantially the same with and without the compensation filter 320 applied. The gain factor may be applied to the audio-stream 33 together with the compensation filter 320 or at other stages of the processing of the audio-stream 33.

Figure 11:
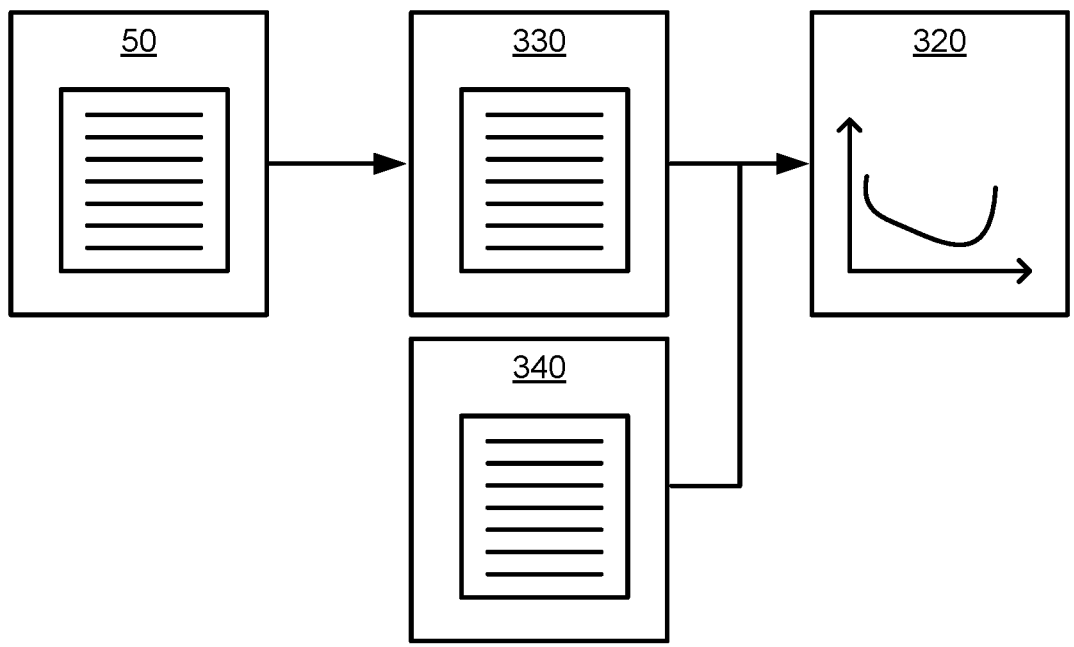
FIG. 11 is a schematic view of audio processing according to embodiments of the invention.

In addition to compensating the audio-stream 33 based on the playback volume 15, the audio-stream may in one embodiment be compensated with regards to a hearing profile 340 of the user 40. This is schematically shown in FIG. 11 wherein the compensation filter 320 is generated based on the amplitude compensation data 330 and the hearing profile 340 of the user 40. The hearing profile 340 may be any kind of suitable hearing profile 340 and may comprise separate hearting profiles 340 for each ear of the user 40. The hearing profile 340 may be provided to the audio speaker arrangement 20 from the electronic device 10. The electronic device 10 may be configured to generate the hearing profile 340 based on a hearing test of the user 40 or acquire the hearing profile 340 from a hearing profile repository. Such a repository may be e.g. a database hosted on a cloud server. The hearing profile 340 may very well suggest different compensation for each ear of the user 40.

Many audio speaker arrangements 20 comprise more than one audio speaker 21 and support playback of audio-streams 33 having more than one audio channel. As will now be explained with reference to FIG. 10, the present invention can be applied to multi-channel audio systems as well.

Figure 10:
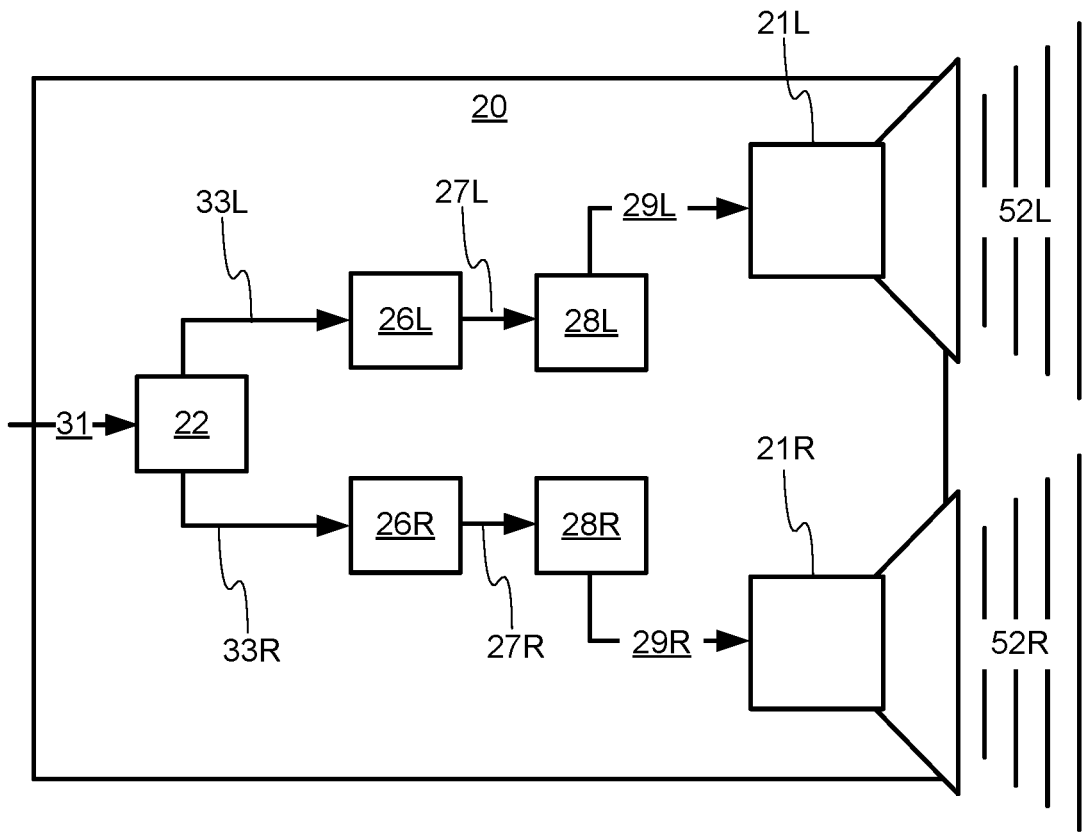
FIG. 10 is a schematic view of an audio speaker arrangement according to embodiments of the invention.

In FIG. 10, a dual channel audio speaker arrangement 20 is shown. If the signal 31 received by the transceiver module 22 comprises an audio-stream 33 with more than one channel, these channels can be identified, separated and provided to each of the audio speakers 21L, 21R of the audio speaker arrangement 20. Typically, the audio-stream is stereo audio-stream comprising a left channel audio-stream 33L and a right channel audio-stream 33R. The left channel audio-stream 33L is intended for a left audio speaker 21L and the right channel audio-stream 33R is intended for a right audio speaker 21R.

In FIG. 10, the transceiver module 22 is shown as identifying and providing the audio-streams 33L, 33R to a left DSP module 26L and a right DSP module 26R respectively, this identification may very well be done in e.g. the DSP module 26 but is done in the transceiver module 22 for illustrative purposes. Each of the audio streams 33L, 33R may be subjected to different compensation filters 320, one reason may be that a balance between the channels is different resulting in a left playback volume and a right playback volume that are different from one another. Another reason may be that the audio speakers 21L, 21R have different characteristics and consequently have different pre-stored acoustic transfer data 50. This means that a left sound pressure level 52L will differ from a right sound pressure level 52R when the respective audio speakers 52L, 52R are supplied with equal audio-streams 33. As was explained in previous sections relating to the hearing profile 340 of the user 40, there are also reasons for differences relating to the user 40 of audio speaker arrangement.

The description given with reference to FIG. 10 is made in relation to dual speakers 21L, 21R and a stereo stream, the same reasoning is applicable for audio speaker arrangements 20 having even more audio speakers 21. This may for example be the case in car stereo systems or surround systems. The same reasoning is also applicable if the audio-stream 33 is a single channel audio-stream 33 that is supplied to more than one audio speaker 21, 21L, 21R.

Figure 12A:
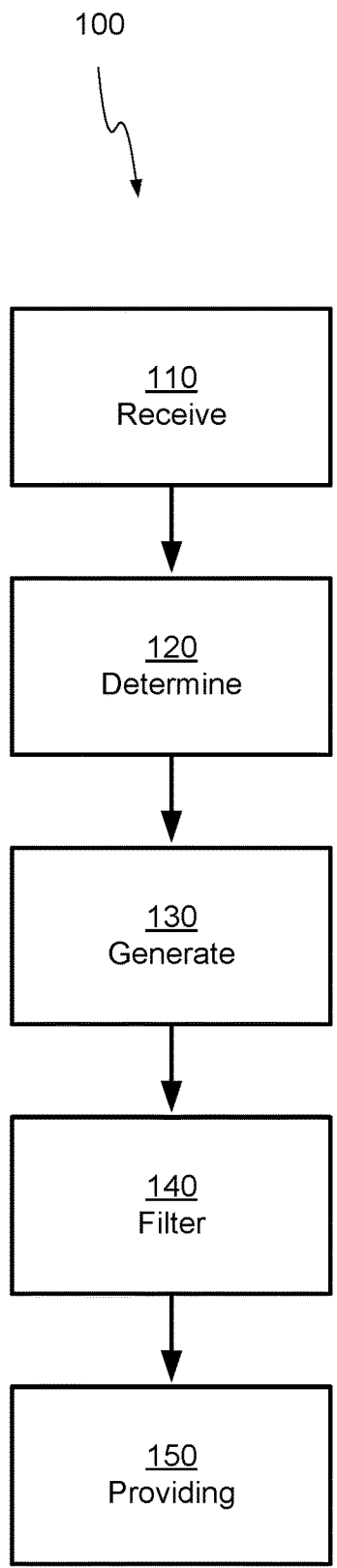
FIG. 12a-b are schematic block diagrams of methods for processing an audio-stream according to embodiments of the invention.

A method 100 for processing the audio-stream 33 will now be presented with reference to FIG. 12a. The method 100 is given without all possible detailed steps regarding specifics of the method 100, as these specifics are presented in other sections of this disclosure. It is evident to the skilled person that they are implementable also on the method 100 for compensating the audio-stream 33.

The method 100 is initiated by receiving 110 the signal 31 comprising the audio-stream 33 and the control data 32. Wherein the control data comprises at least a playback volume 15 associated with the audio-stream 33. The audio-stream 33 may, as mentioned earlier, optionally be received in audio frames 23. These audio frames 23 may be buffered in a receive buffer.

Based on the playback volume 15, the method 100 proceeds by determining 120 a playback sound pressure level 52 using the pre-stored acoustic transfer data 50 as presented earlier. As listed earlier, there are embodiments where multiple playback sound pressure levels 52 may be determined depending on e.g. the user 40, the signal 31 and/or the audio speaker arrangement 20.

The determined playback sound pressure level 52 is used together with amplitude compensation data 330 to generate 130 a compensation filter 320. The generation 130 of the compensation filter 320 may also be based on the hearing profile 340 of the user 40. The amplitude compensation data 330 may comprise one or more amplitude compensation values 335 that are based on equal loudness contours 300.

The generated 130 compensation filter 320 is used to filter 140 the audio-stream 33 in order to provide 150 the compensated audio-stream 27 to the audio speakers 21.

Figure 12B:
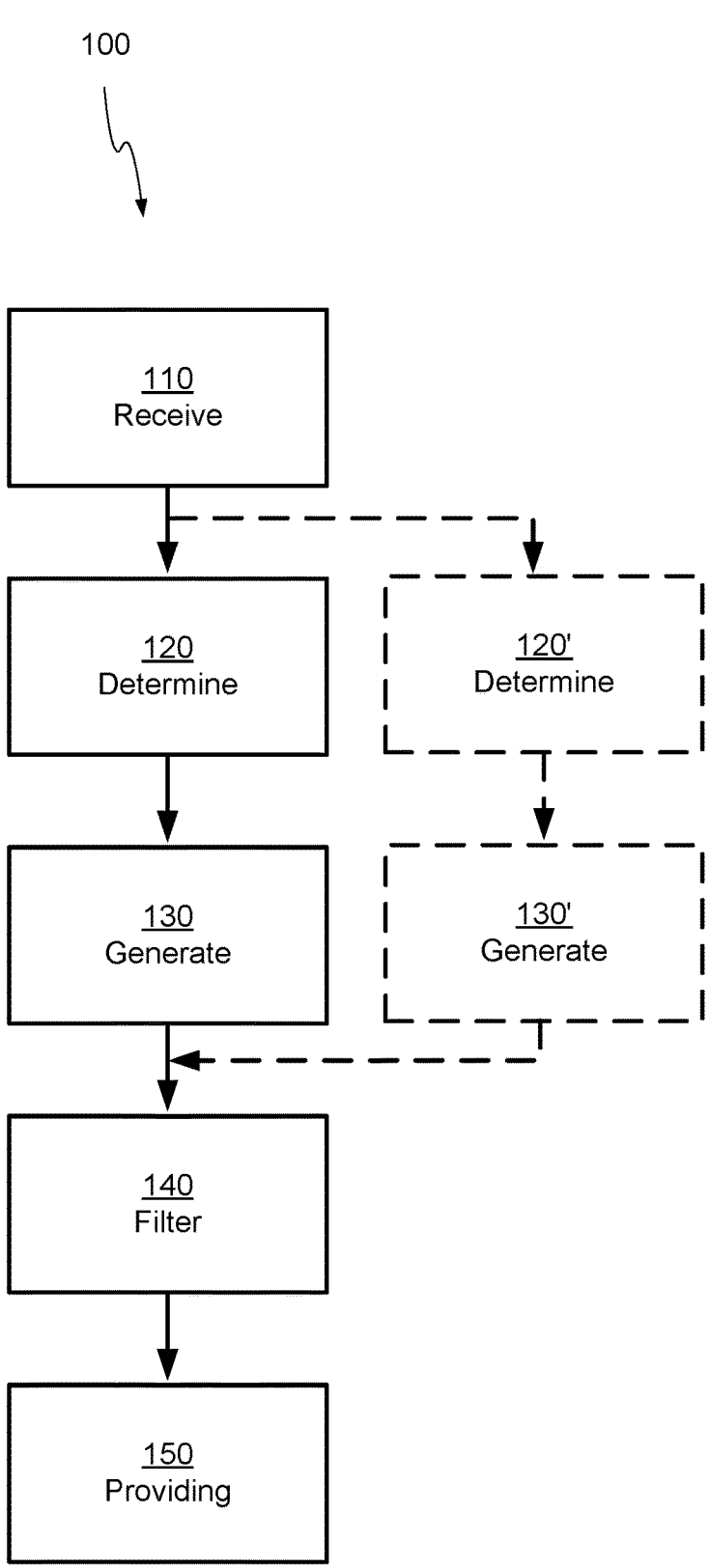

The method 100 presented allows for the processing of an audio-stream based on a playback volume 15. As presented in earlier sections, the playback volume 15 may be changed by the user 40 without annoying delays in change of playback sound pressure 52 or delays in updates or changes of the compensation filter 320. The method 100 of updating the compensation filter is substantially the same as the method 100 for compensating the audio-stream 33. With reference to FIG. 12b, an updated playback volume 15' is received which is used to determine 120' an updated playback sound pressure level 52 in the same way as the playback sound pressure level 52 is determined 120. An updated compensation filter 320 is generated 130' analogously to the generation 130 of the compensation filter 320. The updated compensation filter 320 is applied to the audio-stream as disclosed in earlier sections of this disclosure and used to filter 40 the audio stream 33 and provide 150 the compensated audio-stream 27 to the audio speakers 21.

The method 100 is preferably performed by the audio speaker arrangement 20 but may in embodiments be performed solely or in parts by the electronic device 10.

Figure 13:
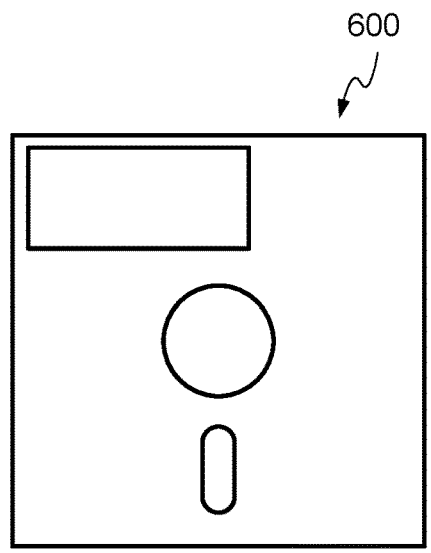
FIG. 13 is a view of a computer program product according to embodiments of the invention.

Illustrated in FIG. 13, the method 100 may be implemented as a computer program product 600 such that when the computer program product 600 is executed by a device e.g. a controller, computer, DSP etc., the device performs the method 100 as disclosed herein.

In one embodiment of the computer program product 600, it is configured to, when executed by the controller 200, to cause the controller 200 to control the transceiver module 22 to receive the audio-stream 33 and the playback volume 15 associated with the audio-stream 33 over the external interface 30. The computer program product 600 is further configured to control the control module 24 to determine the playback sound pressure level 52 of the audio speaker arrangement 20 based on the playback volume 15 and pre-stored acoustic transfer data 50, retrieved from the memory 700, associating the playback volume 15 with the playback sound pressure level 52 of the audio speaker 21. Additionally, the computer program product 600 is configured to control the control module 24 to generate the compensation filter 320 based on the amplitude compensation data 330, retrieved from the memory 700, associated with the determined playback sound pressure level 52 and to control the DSP module 26 to filter the audio-stream 33 using the compensation filter 320 to generate the compensated audio-stream 27. The computer program product 600 is further configured to control the D/A module 28 to provide the compensated audio-stream 27 to the audio speaker 21.

Figure 14:
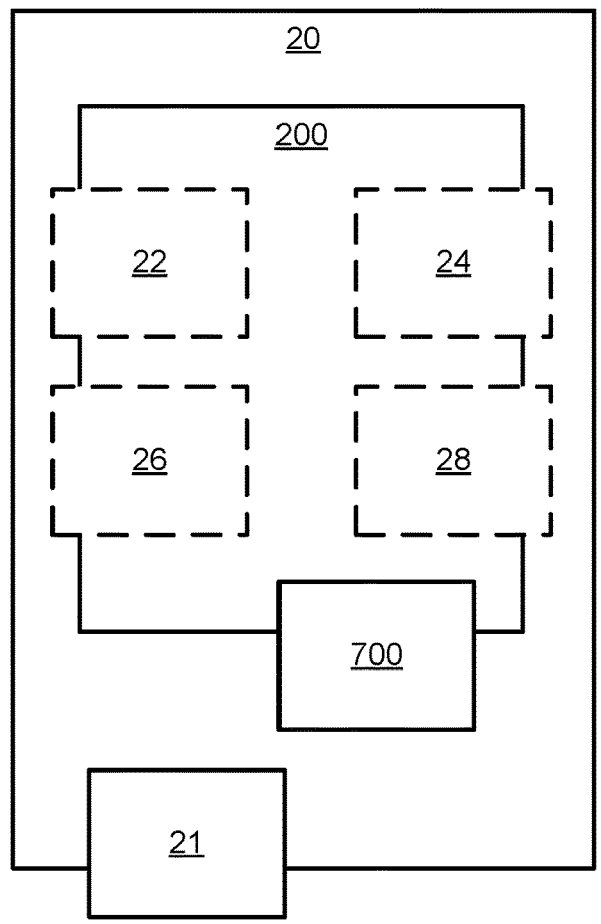
FIG. 14 is a view of an audio speaker arrangement according to embodiments of the invention.

In FIG. 14, a block diagram of an audio speaker arrangement 20 is shown. The audio speaker arrangement 20 comprises the audio speaker 21, at least one controller 200 and one or more memories 700. The memory 700 may be comprised in the controller 200 or external to the controller 200. The controller 200 may comprise some or all of the transceiver module 22, the control module 24, the DSP module 26 and/or the D/A module 28. These modules 22, 24, 26, 28 may be implemented as software modules, semiconductor devices integrated in the controller 200 or a combination of both. They may also be implemented as stand-alone components of the audio speaker arrangement 20. The memory 700 will typically comprise the pre-stored acoustic transfer data 50 and the amplitude compensation data 330 together with software instructions such that the controller 700 can be configured to execute the method 100 for compensating the audio-stream 33.

In one embodiment to the audio speaker arrangement 20, it comprises at least one audio speaker 21, at least one controller 200 and at least one memory 700. Said at least one controller 200 being configurable to control the transceiver module 22 to receive the audio-stream 33 and the playback volume 15 associated with the audio-stream 33 over the external interface 30. The controller 200 is further configured to control the control module 24 to determine the playback sound pressure level 52 of the audio speaker arrangement 20 based on the playback volume 15 and pre-stored acoustic transfer data 50, retrieved from said at least one memory 700, associating the playback volume 15 with the playback sound pressure level 52 of the audio speaker 21. The controller 200 is additionally configured to control the control module 24 to generate the compensation filter 320 based on the amplitude compensation data 330, retrieved from said at least one memory 700, associated with the determined playback sound pressure level 52. The controller 200 is further configured to control the DSP module 26 to filter the audio-stream 33 using the compensation filter 320 to generate the compensated audio-stream 27. The controller 200 is also configured to control the D/A module 28 to provide the compensated audio-stream 27 to the audio speaker 21.

Figure 15A:
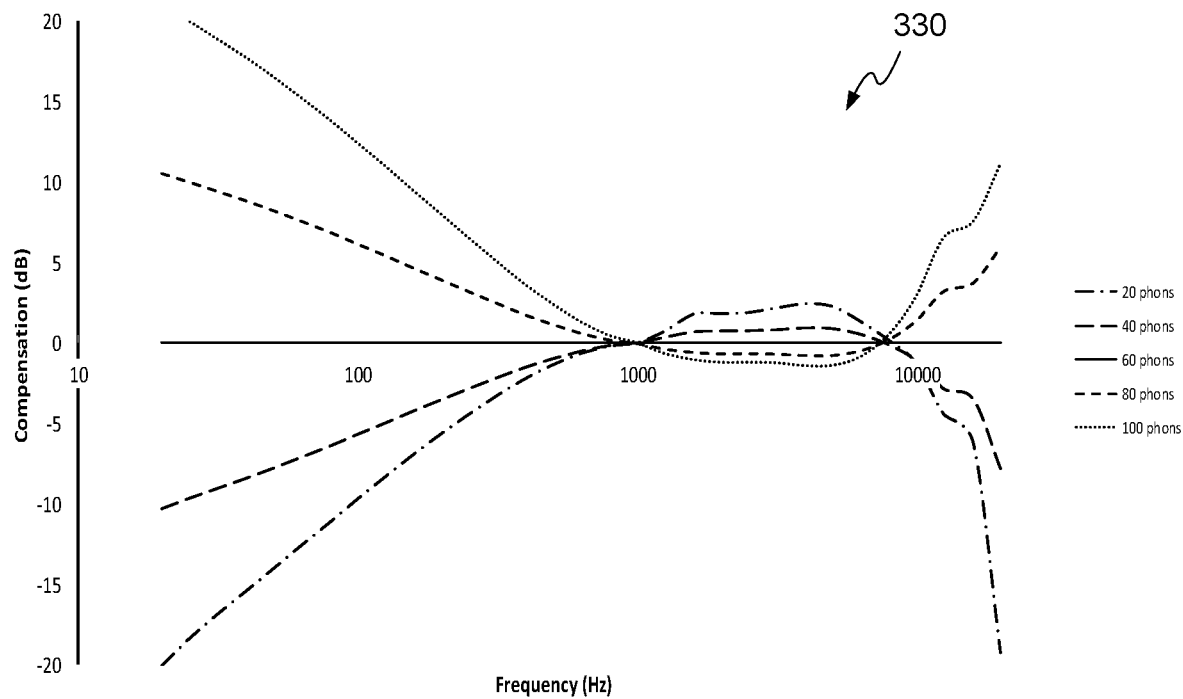
FIG. 15a is a graph of compensation filters according to embodiments of the invention.
Figure 15B:
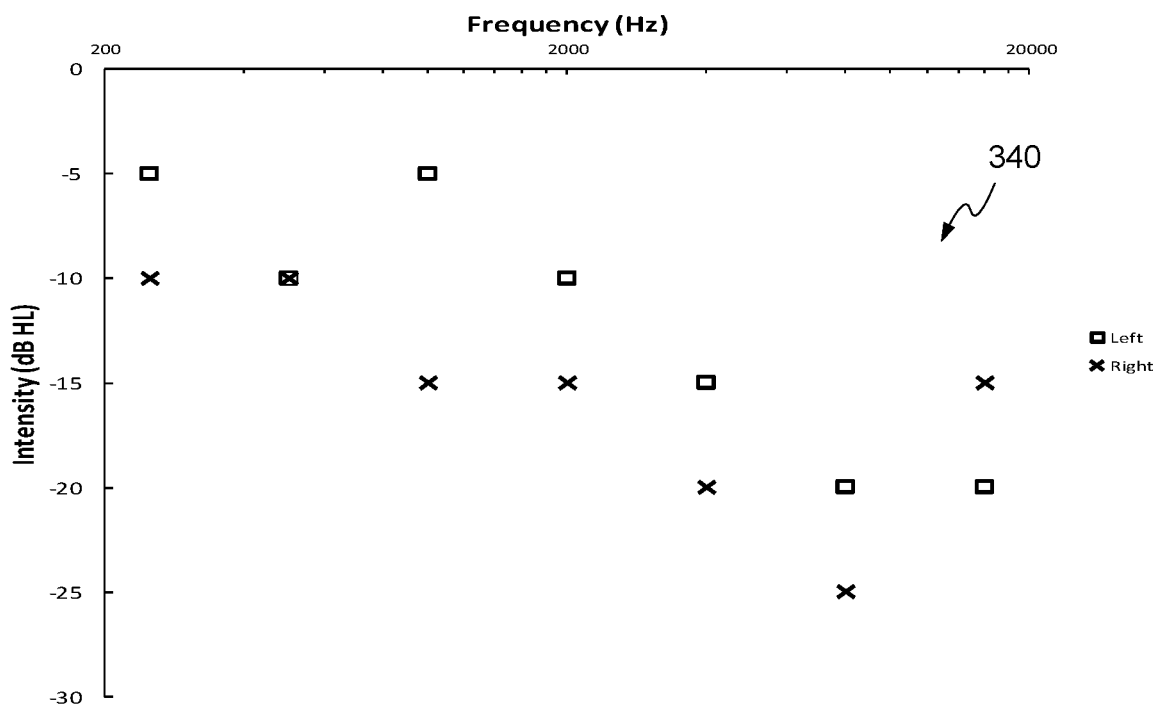
FIG. 15b is a graph of hearing profiles according to embodiments of the invention.

With reference to FIGS. 15*a* and 15*b*, some further details regarding the amplitude compensation data 330 and the hearing profile 340 will be presented. These details are particular embodiments of the amplitude compensation data 330 and the hearing profile 340 and although applicable to all relevant embodiments presented earlier, the skilled person understands that these are not to limit the scope of this disclosure.

In FIG. 15*a*, a graph of the amplitude compensation data 330 for different phons is presented. The amplitude compensation data 330 is presented as continuous lines but is preferably described as discrete amplitude compensation values 335 at a number of different frequencies. The 60 phons level, solid line in the example of FIG. 15*a*, is the baseline. This means that a playback sound pressure level 52 corresponding to 60 phons, i.e. a 60 dB SPL at 1 kHz, will be subjected to 0 dB of amplitude compensation data 330 at all frequencies, as explained with reference to FIG. 8*b*. The 20, 40, 80 and 100 phons lines of FIG. 15*a* are shown as the difference between the respective phons and the 60 phons line. In this example, the phons are measured at 1 kHz and the amplitude compensation data 330 is consequently 0 dB for all phons at this frequency. Assuming that that an audio-stream 33 is enjoyed at a playback sound pressure level 52 corresponding to 60 phons and the user 40 decides to increase the playback volume 15 to a level that corresponds to a 20 dB increase in playback sound pressure level 52. The gain of the audio-stream 33 will be increased 20 dB, but in addition to this, the frequency dependent amplitude compensation data 330 of the 80 phons line, short dashed line in FIG. 15*a*, will be added to the 20 dB gain. As a result, the gain will be around 30 dB at low frequencies, 20 dB at 1 kHz, 19 dB at 4 kHz and 25 dB at high frequencies.

As introduced earlier, in addition to the volume dependent compensation, a hearing profile 340 may be applied to the audio-stream 33. One example of a hearing profile 340 is depicted in FIG. 15*b* wherein the threshold of hearing for a right ear, as represented by crosses, and a left ear, as represented by squares, is shown separately for a number of different frequencies. Adding the hearing compensation to the compensation as described above in relation to the 20 dB change in playback sound pressure level 52, the gain will be, for the left ear, around 35 dB at low frequencies, 25 dB at 1 kHz, 34 dB at 4 kHz and 45 dB at high frequencies. The corresponding numbers for the right ear will be around 40 dB at low frequencies, 35 dB at 1 kHz, 39 dB at 4 kHz and 40 dB at high frequencies.

There are several problems that have been solved by the inventors in this disclosure, the mapping from the playback volume 15 to the playback sound pressure level 52, the change in playback sound pressure level 52 and the change in compensation being virtually instantaneous.

The invention claimed is:

1. A method for real-time processing of an audio stream in an audio speaker arrangement comprising at least one audio speaker, the method comprising:
   receiving an audio-stream and a playback volume associated with the audio-stream,
   determining a playback sound pressure level of the audio speaker based on the playback volume and pre-stored acoustic transfer data, wherein the pre-stored acoustic transfer data is associating the playback volume with the playback sound pressure level of the audio speaker,
   generating a compensation filter based on amplitude compensation data associated with the determined playback sound pressure level, and
   filtering the audio-stream using the compensation filter and applying a gain factor to the audio stream generating a compensated audio-stream, wherein the gain factor is determined based on a predetermined average audio power of an average audio-stream determined based on an average of a plurality of audio-streams and configured such that a total audio power of the audio-stream is preserved regardless of the compensation filter, and
   providing the compensated audio-stream to the audio speaker.

2. The method according to claim 1, wherein the amplitude compensation data is based on equal loudness contours.

3. The method according to claim 1, wherein the amplitude compensation data comprises amplitude compensation values for a number of different frequencies and a number of different playback volumes.

4. The method according to claim 1, further comprising the steps of:
   receiving an updated playback volume that is different from the playback volume,
   determining an updated playback sound pressure level of the audio speaker based on the updated playback volume and the pre-stored acoustic transfer data,
   generating an updated compensation filter based on amplitude compensation data associated with the determined updated determined playback sound pressure level,
   filtering the audio-stream to generate the compensated audio-stream using the updated compensation filter, and
   providing the compensated audio-stream using the updated compensation filter synchronized with the updated playback volume to the audio speaker.

5. The method according to claim 1, wherein the audio-stream is filtered in audio frames.

6. The method according to claim 5, wherein the steps of determining an updated playback sound pressure level and generating an updated compensation filter are executed during an intermediate time ($T_f$) between the filtering of two consecutive audio frames.

7. The method according to claim 1, wherein the step of generating a compensation filter is additionally based on a hearing profile associated with a user of the audio speaker arrangement.

8. The method according to claim 1, wherein the audio-stream is formed in a channelized audio format.

9. The method according to claim 8, wherein the channelized audio format comprises a left channel audio-stream and a right channel audio-stream, and wherein the step(s) of generating the compensation filter further comprises generating a left compensation filter for the left channel audio-stream and a right compensation filter for the right channel audio-stream.

10. The method according to claim 1, wherein the compensation filter is a digital filter with a linear phase response, such as a FIR filter.

11. An audio speaker arrangement comprising at least one audio speaker, at least one memory, at least one external interface, and at least one controller operatively connected to said at least one audio speaker, said at least one memory and said at least one external interface;
   wherein said at least one controller being configured to, in real-time:
   receive, via the external interface, an audio-stream and a playback volume associated with the audio-stream,
   determine a playback sound pressure level of the audio speaker based on the playback volume and pre-stored acoustic transfer data, wherein the pre-stored acoustic transfer data is associating the playback volume with the playback sound pressure level of the audio speaker,
   generate a compensation filter based on amplitude compensation data associated with the determined playback sound pressure level,
   filter the audio-stream using the compensation filter and applying a gain factor to the audio stream generating a compensated audio-stream, wherein the gain factor is configured such that a total audio power of the audio-stream is preserved regardless of the compensation filter, wherein the gain factor is determined based on a predetermined average audio power of an average audio-stream determined based on an average of a plurality of audio-streams, and
   provide the compensated audio-stream to the audio speaker.

12. The audio speaker arrangement of claim 11, wherein the external interface is a wireless interface.

13. The audio speaker arrangement of claim 11, wherein the controller is further configured to perform the method for real-time processing of the audio-stream.

14. A non-transitory computer readable medium having stored thereon a computer program that, when executed by a controller, causes the controller to:
   receive an audio-stream and a playback volume associated with the audio-stream,
   determine a playback sound pressure level of an audio speaker based on the playback volume and pre-stored acoustic transfer data, wherein the pre-stored acoustic transfer data is associating the playback volume with the playback sound pressure level of the audio speaker,
   generate a compensation filter based on amplitude compensation data associated with the determined playback sound pressure level, and
   filter the audio-stream using the compensation filter and applying a gain factor to the audio stream generating a compensated audio-stream, wherein the gain factor is determined based on a predetermined average audio power of an average audio-stream determined based on an average of a plurality of audio-streams and -configured such that a total audio power of the audio-stream is preserved regardless of the compensation filter, and
   provide the compensated audio-stream to the audio speaker.

15. The non-transitory computer readable medium of claim 14, further configured to cause the controller to perform the method for real-time processing of the audio-stream.

* * * * *